(12) United States Patent  
Guo et al.

(10) Patent No.: US 7,874,783 B2  
(45) Date of Patent: *Jan. 25, 2011

(54) MULTI-CHAMBER VACUUM PROCESSING AND TRANSFER SYSTEM

(75) Inventors: George Xinsheng Guo, Palo Alto, CA (US); Kai-an Wang, Cupertino, CA (US)

(73) Assignee: Ascentool, Inc., Cupertino, CA (US)

( * ) Notice: Subject to any disclaimer, the term of this patent is extended or adjusted under 35 U.S.C. 154(b) by 146 days.

This patent is subject to a terminal disclaimer.

(21) Appl. No.: 12/406,961

(22) Filed: Mar. 19, 2009

(65) Prior Publication Data

US 2009/0180847 A1     Jul. 16, 2009

Related U.S. Application Data

(63) Continuation of application No. 11/212,142, filed on Aug. 26, 2005, now Pat. No. 7,534,080.

(51) Int. Cl.
*H01L 21/677* (2006.01)
(52) U.S. Cl. .................... 414/217; 414/222.13; 414/939
(58) Field of Classification Search ................. 414/217, 414/744.8, 935, 939, 222.13; 118/500
See application file for complete search history.

(56) References Cited

U.S. PATENT DOCUMENTS

| | | | |
|---|---|---|---|
| 5,350,479 A | 9/1994 | Collins | |
| 5,667,592 A * | 9/1997 | Boitnott et al. | ............. 118/719 |
| 5,863,170 A * | 1/1999 | Boitnott et al. | ........ 414/222.13 |
| 6,024,800 A | 2/2000 | Soejima | |
| 6,162,299 A | 12/2000 | Raaijmakers | |
| 6,368,051 B2 * | 4/2002 | Raaijmakers | ............... 414/805 |
| 6,746,195 B2 | 6/2004 | Shirai | |
| 7,010,388 B2 * | 3/2006 | Mitchell et al. | ............. 700/218 |
| 7,066,703 B2 * | 6/2006 | Johnson | ...................... 414/217 |
| 7,534,080 B2 * | 5/2009 | Guo et al. | .................... 414/217 |

\* cited by examiner

*Primary Examiner*—Charles A Fox
(74) *Attorney, Agent, or Firm*—Xin Wen

(57) ABSTRACT

An apparatus for processing a work piece in a vacuum environment includes a master process chamber that can be exhausted to a sub-atmospheric air pressure or to be filled with a desirable gas, a transfer chamber configured to receive the work piece from outside of the master process chamber, one or more processing stations inside the master process chamber, a rotation plate configured to receive the work piece and to move the work piece to receive one or more processing operations, and a first transport mechanism configured to transfer the work piece from the transfer chamber on to the rotation plate. The transfer chamber is at least partially enclosed in the master process chamber and can be vacuum sealed off from the master process chamber.

20 Claims, 20 Drawing Sheets

MULTI-CHAMBER VACUUM PROCESSING AND TRANSFER SYSTEM

The present application is a Continuation patent application of and claims priority to commonly assigned U.S. patent application Ser. No. 11/212,142 (issued as U.S. Pat. No. 7,534,080), entitled "Vacuum processing and transfer system", filed Aug. 26, 2005, the disclosures of which is incorporated herein by reference.

TECHNICAL FIELD

This application relates to apparatus for receiving and processing a substrate in a vacuum environment.

BACKGROUND

Processing a substrate in a vacuum environment is a basic process in micro-fabrication technologies. A vacuum processing system 100 is shown in a perspective view in FIG. 1. The vacuum processing system 100 includes a vacuum chamber 110, a load lock or vacuum transfer chamber 120, and one or more processing chambers 130. The load lock 120 allows a work piece 140 (not shown in FIG. 1 for clarity reason) to be transferred between an ambient environment and the vacuum environment in the vacuum chamber 110. FIG. 2 shows a cross-sectional view of the vacuum processing system 100 of FIG. 1. FIG. 3 shows an enlarged view of the load lock 120 of the prior art vacuum processing system 100 in FIG. 1.

The work piece 140 can be transferred by a robot 115 from the vacuum chamber 110 to the processing chambers 130 wherein the work piece 140 can be processed in vacuum. The load lock 120 can include two or more gate valves 125, 126 that allow the load lock 120 to be isolated from or connected to the vacuum chamber 110 and the ambient environment. The work piece 140 can be transferred into the load lock through a first gate valve 125 while the load lock is sealed from the vacuum chamber 110 by the closing of the second gate valve 126. The first gate valve 125 is closed after the work piece 140 is transferred inside the load lock 120. The enclosure of the load lock 120 is pumped down to vacuum level. The second gate valve 126 can be then opened to allow the work piece to be transferred into the vacuum chamber 110. The vacuum chamber is subsequently pumped down to vacuum. The unloading of the work piece 140 can occur in a similar two-step process without exposing the vacuum chamber 110 or the processing chamber 130 to the ambient environment. The load lock 120 thus allows the process chamber 130 to maintain in a high-vacuum state during processing and during loading and unloading of work piece 140, which reduces contamination of the process chambers and avoid the extended pump-down of the process chamber.

Despite the above-described benefits, the load lock 120 is periodically exposed to atmosphere ambient environment and can cause indirect exposure of atmosphere ambient to the processing chamber 130 and the vacuum chamber 110. In many applications, such as physical vapor deposition (PVD), where very high vacuum is required, an additional or multiple transfer chambers need to be placed between the vacuum chamber 110 and load lock 120 to further reduce the base pressure in the vacuum chamber 110 and the contamination level of the processing chamber 130. One disadvantage of the vacuum processing system 100 is its large footprint due to horizontally extended multiple-chamber layout. The architecture of the vacuum processing system 100 would present a higher system cost and lower throughput in operation. Another disadvantage is it requires a complex robot mechanism to transfer work piece 140 between vacuum chamber 110 and transfer chamber and loadlock 120.

SUMMARY

Implementations of the system may include one or more of the following. In one aspect, the present invention relates to an apparatus for processing a work piece in a vacuum environment, comprising:

a master process chamber configured to be exhausted to a sub-atmospheric air pressure or to be filled with a desirable gas;

a transfer chamber configured to receive the work piece from outside of the master process chamber, wherein the transfer chamber is at least partially enclosed in the master process chamber and can be vacuum sealed off from the master process chamber;

one or more processing stations inside the master process chamber;

a rotation plate configured to receive the work piece and to move the work piece to receive one or more processing operations; and a first transport mechanism configured to transfer the work piece from the transfer chamber on to the rotation plate.

In another aspect, the present invention relates to an apparatus for processing a work piece in a vacuum environment, comprising:

a master process chamber;

a first pump system configured to exhaust the master process chamber to an air pressure substantially below the atmospheric pressure or fill the master process chamber with a desirable gas;

a transfer chamber configured to receive the work piece from outside of the master process chamber, wherein the transfer chamber is at least partially enclosed in the master process chamber and can be vacuum sealed off from the master process chamber;

a second pump system configured to exhaust the transfer chamber to a sub-atmospheric air pressure or fill the transfer chamber with a desirable gas;

one or more processing stations inside the master process chamber, configured to process the work piece;

a rotation plate configured to receive the work piece and to move the work piece to the one or more processing stations;

a first transport mechanism configured to move the work piece from the transfer chamber to the rotation plate in a downward movement; and a second transport mechanism configured to move the work piece from the rotation plate to one of the processing stations in an upward movement when the work piece is moved by the rotation plate to the vicinity of the processing station.

In yet another aspect, the present invention relates to an apparatus for processing a work piece in a vacuum environment, comprising:

a master process chamber;

a first pump system configured to exhaust the master process chamber to an air pressure substantially below the atmospheric pressure or fill the master process chamber with a desirable gas;

one or more processing stations inside the master process chamber, configured to process the work piece;

a rotation plate configured to receive the work piece and to move the work piece to the one or more processing stations; and a second transport mechanism configured to move the work piece from the rotation plate to one of the processing stations in an upward movement when the work piece is moved by the rotation plate to the vicinity of the processing station.

Embodiments may include one or more of the following advantages. The disclosed vacuum transfer and processing system includes transfer chamber that is fully or partially enclosed in the master process chamber. As a result, the footprint of the vacuum transfer and processing system is reduced relative to the prior systems. The smaller footprint allows the disclosed system to be suitable for wider range of applications compared to the prior art systems.

In another aspect, the disclosed vacuum transfer and processing system can include one or more transfer mechanisms for transferring the work piece between the transfer chamber and the processing stations in the master process chamber. The work piece transfer mechanisms are required to move along one (vertical or rotational) dimension per transfer mechanism, which is simpler and less expensive compared to the robot transfer mechanisms in the prior art systems. The work piece transfer mechanism also saves space compared to the robotic transfer mechanisms in the prior art systems, which allows processing stations to be implemented in the master process chamber.

In yet another aspect, the work piece transfer mechanisms are capable of multiple functions. One work piece transfer mechanism can transfer the work piece in and out of the transfer chamber and can also vacuum seal the transfer chamber from the master process chamber. Another work piece transfer mechanism can transfer the work piece to a processing station and if necessary, can also isolate the processing station from the master process chamber. These multi-functional capabilities allow the processing stations to be properly isolated from the master process chamber and the transfer chamber which minimizes the contamination and vacuum pumping time.

In still another aspect, the disclosed vacuum transfer and processing system includes a rotation plate that can transfer a plurality of work pieces between the transfer chamber and one or more processing stations. A plurality of work pieces can be processed in parallel through a multi-step vacuum process. In contrast, the prior art robot transfer mechanism can only transfer one work piece at a time. The parallel processing in the disclosed system significantly reduces the average transfer time for each work piece and increases system throughput.

The details of one or more embodiments are set forth in the accompanying drawings and in the description below. Other features, objects, and advantages of the invention will become apparent from the description and drawings, and from the claims.

DETAILED DESCRIPTION

Figure 1:
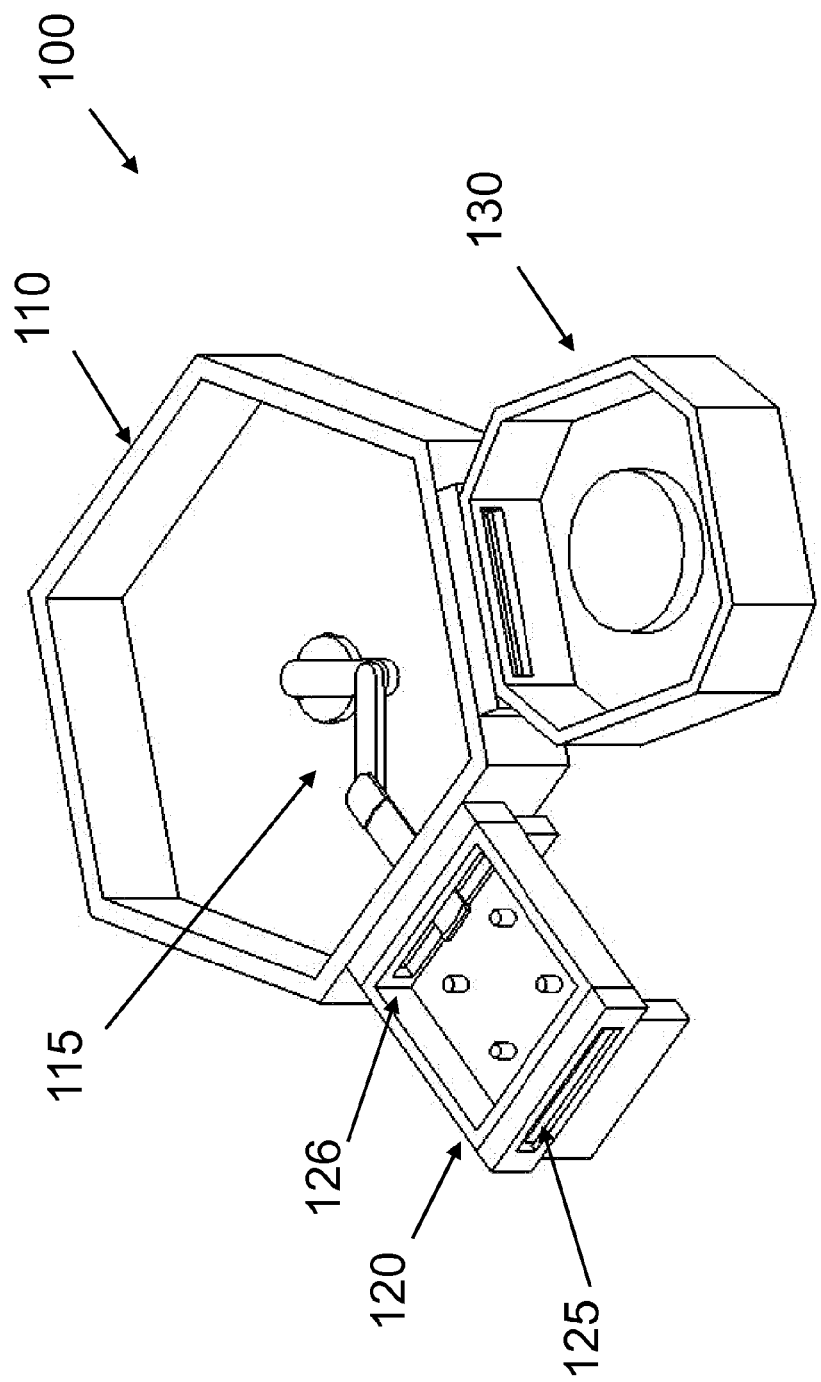
FIG. 1 is a perspective view of a prior art vacuum processing system.
Figure 2:
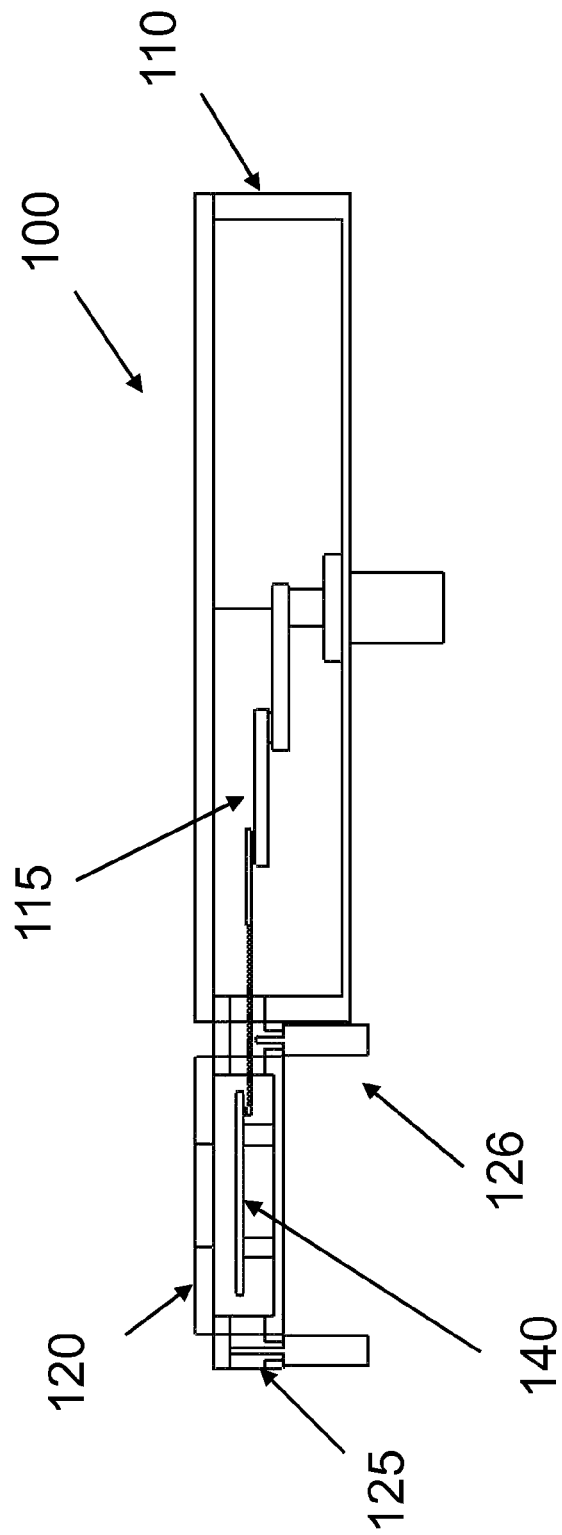
FIG. 2 is a cross-sectional view of the prior art vacuum processing system of FIG. 1.
Figure 3:
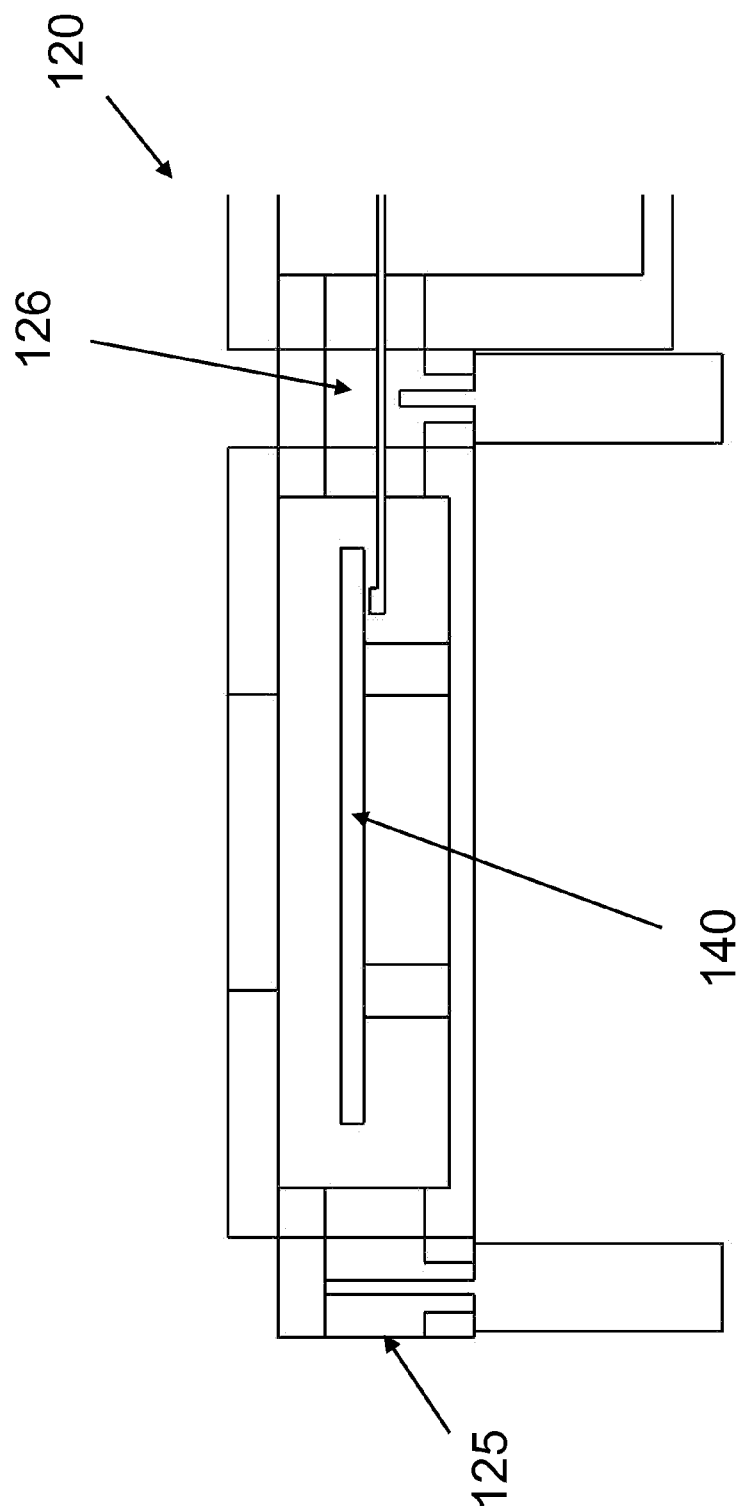
FIG. 3 is a close-up view of the load lock of the prior art vacuum processing system of FIG. 1.
Figure 4:
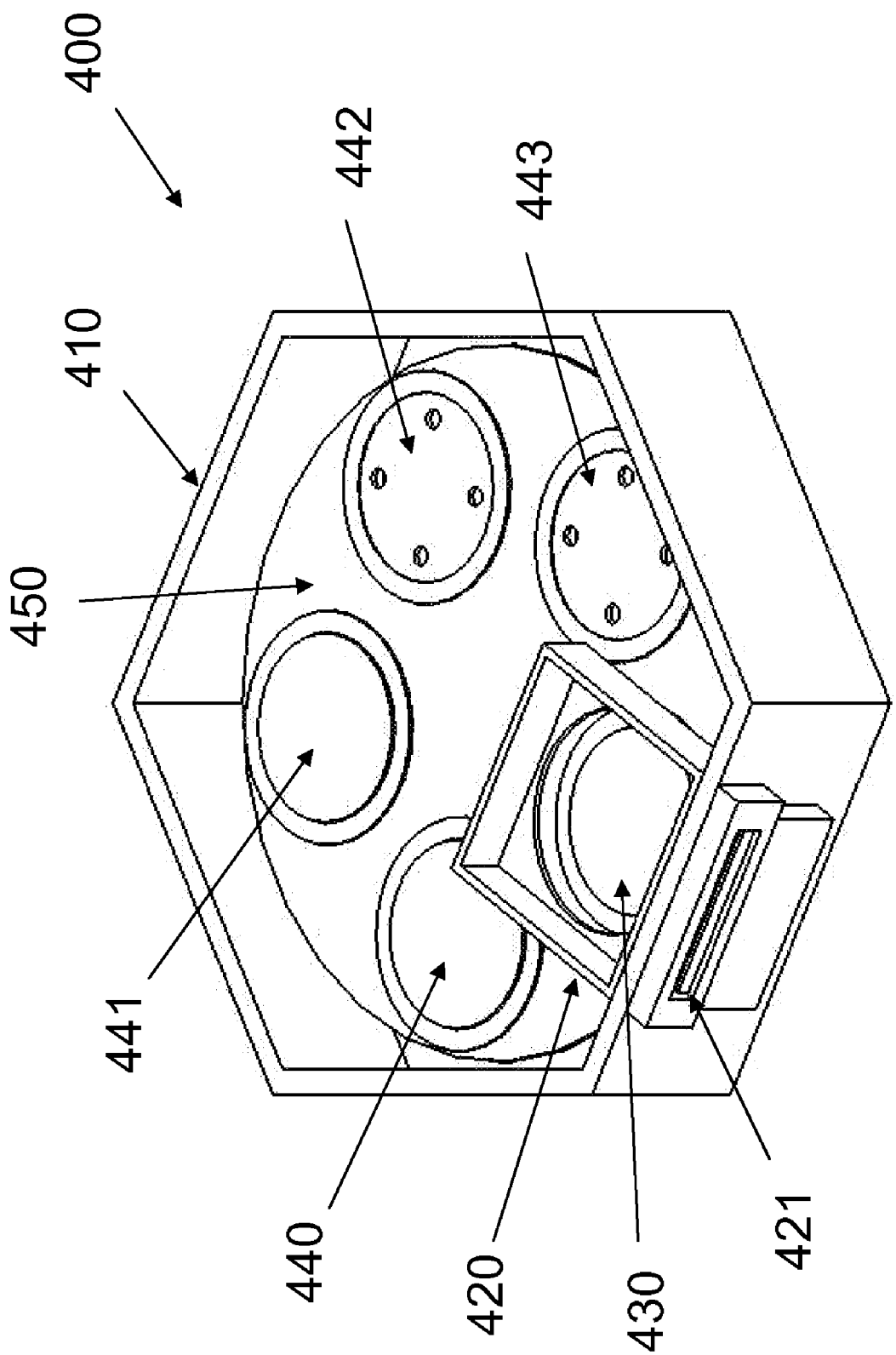
FIG. 4 is a perspective view of a vacuum transfer and processing system in accordance with the present invention.
Figure 5:
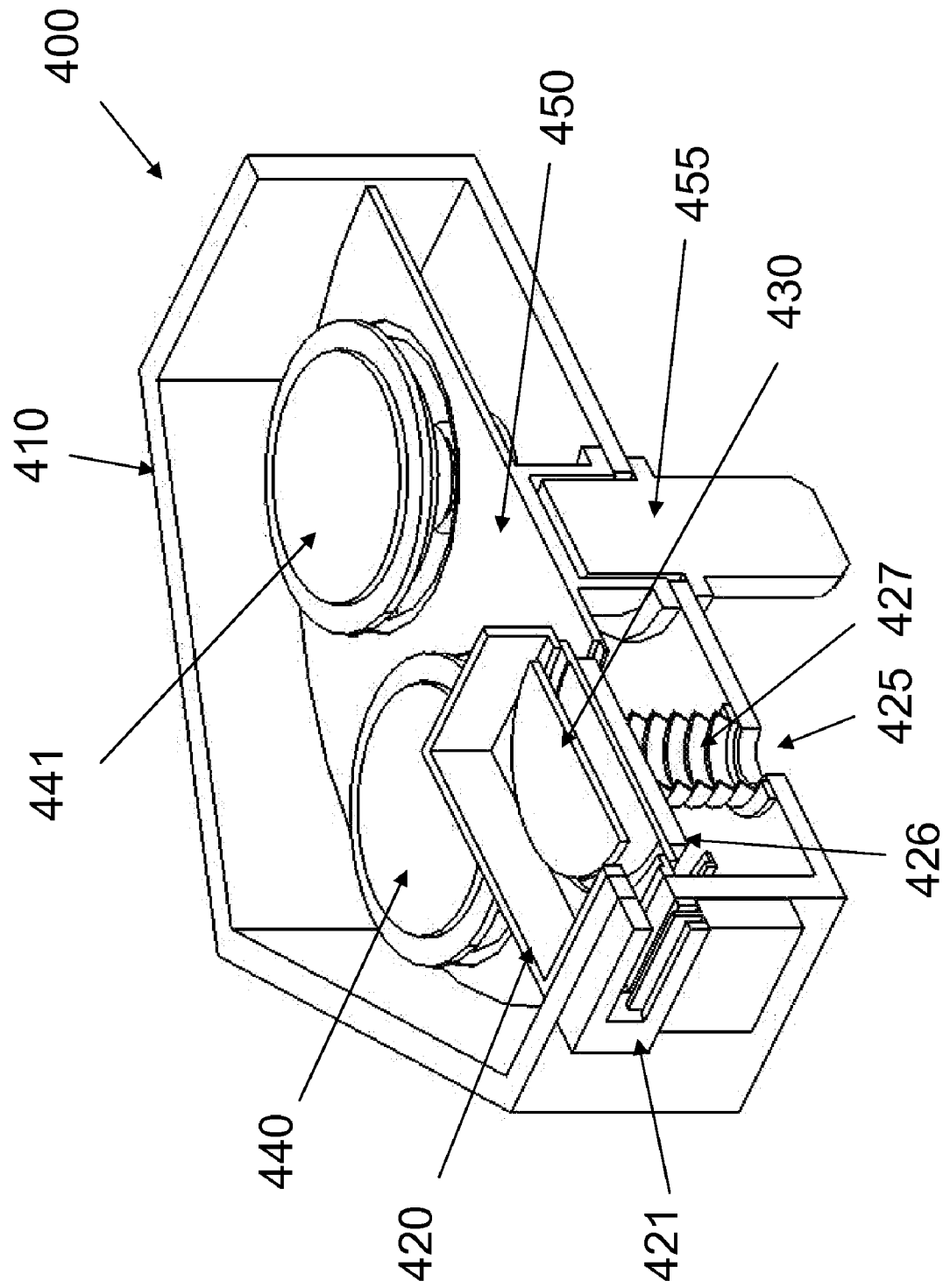
FIG. 5 is a perspective cross-sectional view of the vacuum transfer and processing system of FIG. 4.
Figure 14:
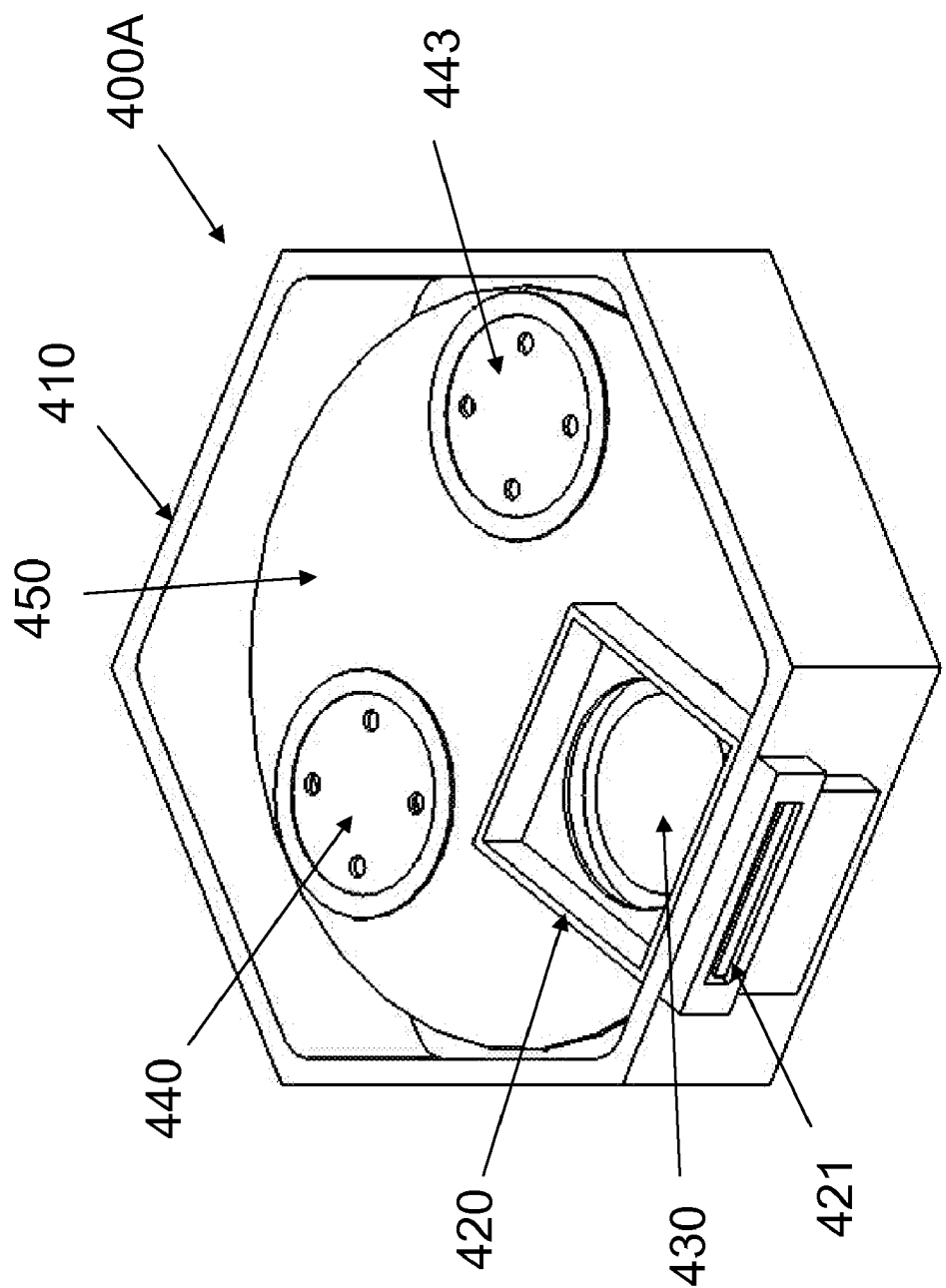
FIG. 14 is a perspective view of another vacuum transfer and processing system accordance with the present invention.

A vacuum transfer and processing system 400 in accordance with the present invention is shown in a perspective view in FIG. 4 and in a perspective cross-sectional view in FIG. 5 (with top of the master process chamber 410 removed for clarity). The vacuum transfer and processing system 400 is also shown in a cross-sectional view in FIG. 6 and a close-up cross-sectional view in FIG. 7. Another vacuum transfer and processing system 400A in accordance with the present invention is shown in FIG. 14. The vacuum transfer and processing system 400 or 400A includes a master process chamber 410, a transfer chamber 420 that can transfer a work piece 430 between the outside and the master process chamber 410, one or more processing stations 440-443, a rotation plate 450, and a first transfer mechanism 425.

The work piece 430 can be a disk-shaped silicon wafer that may have a diameter 150 mm, 200 mm, 300 mm, and 450 mm, etc. The work piece 430 can also be made of other semiconductor materials such as Ge, GaAs, and a metal, a glass or a ceramic substrate. The vacuum transfer and processing system 400 is compatible with but not limited to applications in semiconductor integrated circuits, flat panel displays, microfluidic devices, MEMS components, medical devices and electro-optical devices.

The processing stations 440-443 can include a pre-cleaning (or soft-etch) station, and one or more sputter deposition (or sputtering) stations. The sputtering station can include a target and a magnetron system behind the target for generating plasmas. Typical sputtering materials in the target can include Cu, Ta, Ti, Au, Ag, Al, Sn, Cr, W, Hf, Zr, Ni, etc. The sputtering material can also include compound or alloy materials such as TiW, TiNx, AlNx, AlOx, HfOx, TiOx, TaNx, NiV, ITO, and other solid materials.

As shown in FIGS. 4-7, 14, the transfer chamber 420 is at least partially enclosed inside the master process chamber 410 such that it can include an opening (i.e. gate valve 421) to the outside environment and a separate opening (that can be sealed by the first transfer mechanism 425 as described below) to the master process chamber 410. The partial (or full) enclosure of the transfer chamber 420 in the master process chamber 420 reduces foot print of the vacuum transfer and processing system 400 compared to the prior art system. Reduced system footprint is one advantageous feature of the vacuum transfer and processing system 400.

Figure 6:
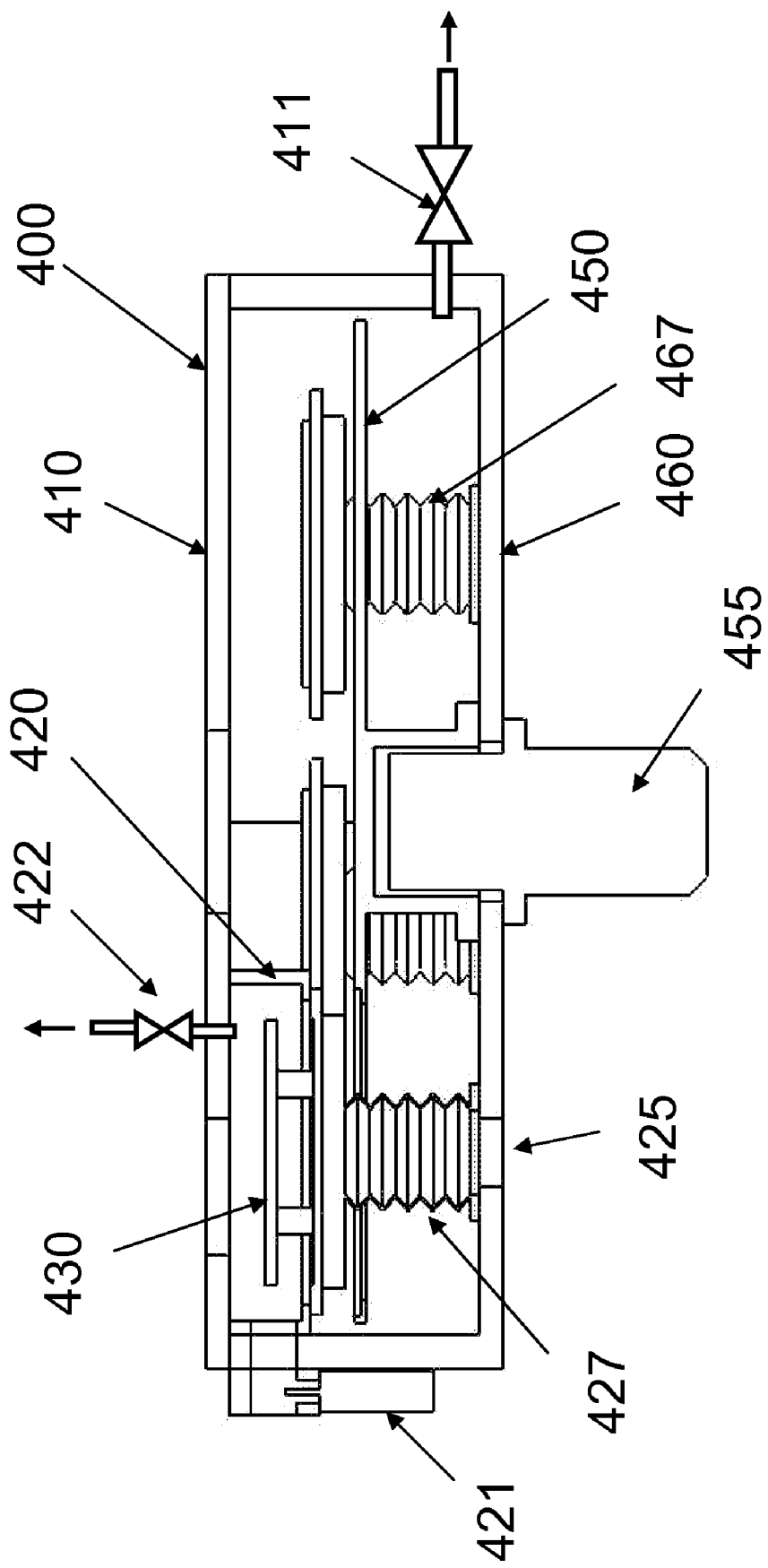
FIG. 6 is a cross-sectional view of the vacuum transfer and processing system of FIG. 4.
Figure 7:
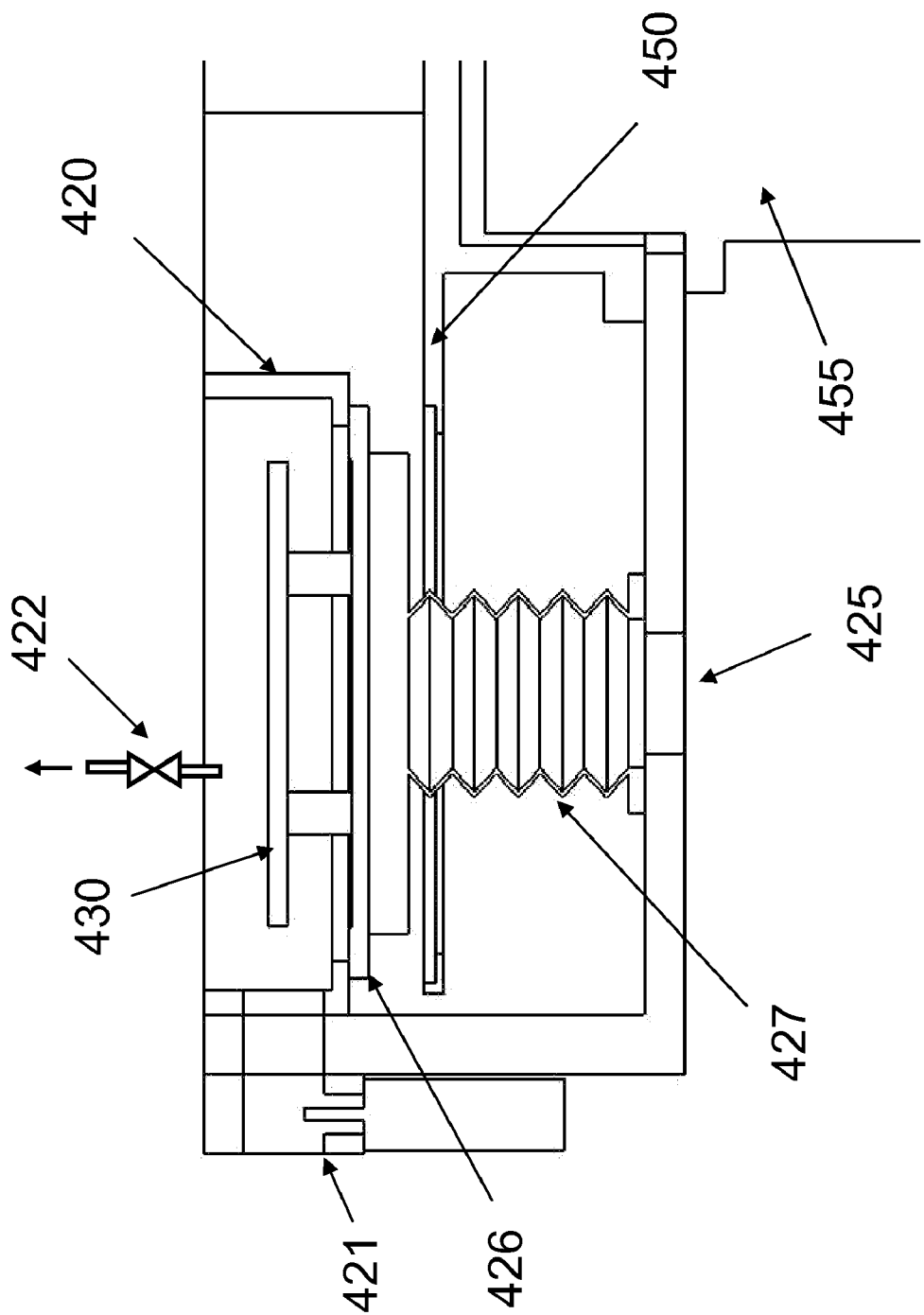
FIG. 7 is a close-up cross-sectional view of the transfer system in the vacuum transfer and processing system of FIG. 4.

As shown in FIG. 6, the master process chamber 410 is connected to a pump system via a valve 411 that can exhaust the master process chamber 410 to a vacuum pressure or is filled with a desired gas. Similarly, a valve 422 can be connected to another pump system to evacuate air or gas from the transfer chamber 420. Also, through valve 422, the transfer chamber can be filled with a desirable gas. The air pressures of the master process chamber 410 and the transfer chamber 420 can thus be independently controlled by the pump systems going through valves 411 and 422, respectively. The master process chamber 410 and the transfer chamber 420 can be filled with a desirable gas to bring air pressure within the master process chamber 410 to be in the range of 0.01 milli-Torr to 1000 milli-Torr. Desirable gases can include Argon, Nitrogen, Oxygen and Hydrogen.

The transfer chamber 420 includes a gate valve 421 that can open up for receiving or unloading the work piece 430 and close to isolate the transfer chamber 420 from the outside environment. The outside environment of the gate valve 421 can be the ambient environment or another chamber such as a load lock in which the air pressure can be controlled by another pump system. Before the gate valve 421 is opened, the first transfer mechanism 425 is pushed upward to vacuum seal from underneath. The first transfer mechanism 425 includes a moveable plate 426 that includes a mating surface that can be brought to close contact with an associated mating surface on the underside of the transfer chamber 420 and also a mating surface that can be brought to close contact with the first transfer mechanism 425. An upward force exerted on the moveable plate 426 allows tight sealing at the mating surfaces and vacuum isolation between the transfer chamber 420 and the master process chamber 410. The vacuum environment in the master process chamber 410 can thus be maintained while the work piece 430 is loaded and unloaded through the open gate valve 421 in and out of the transfer chamber 420.

The first transfer mechanism 425 also includes a moveable activation mechanism such as a piston mechanism that is at least partially outside of the master process chamber 410. A set of bellows 427 can be used to isolate the master process chamber 410 from the moveable activation mechanism and the ambient environment. After the work piece 430 is transferred into the transfer chamber 420, the work piece 430 is placed over the moveable plate 426. The gate valve 421 is closed to isolate the transfer chamber 420 from the outside environment. Through valve 422 the pump system then exhausts air or gas from the transfer chamber 420 to establish the proper vacuum condition to prepare the transfer chamber 420 to be connected with the master process chamber 410.

Figure 8:
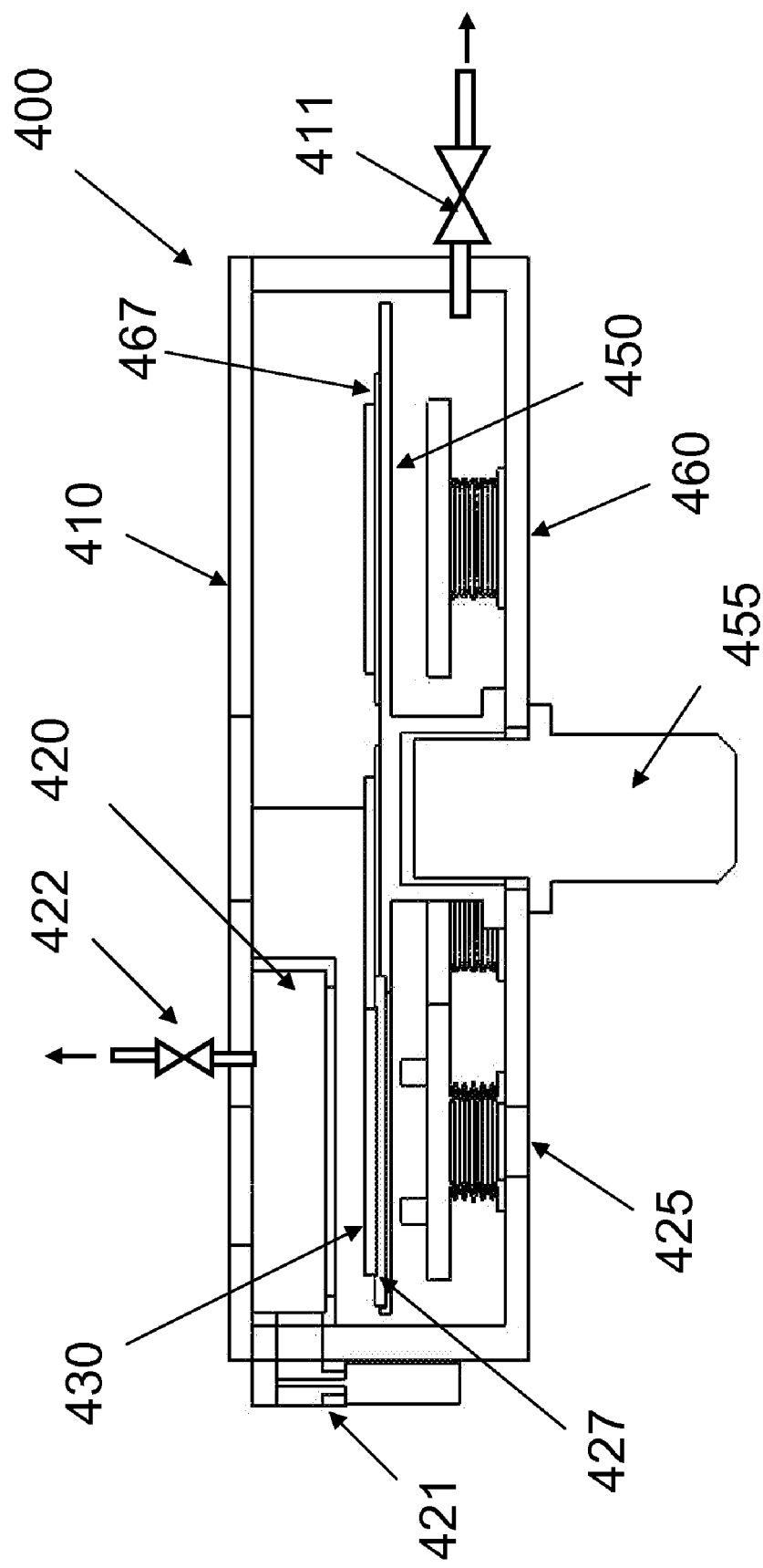
FIG. 8 is another cross-sectional view of the vacuum transfer and processing system of FIG. 4 when a work piece is loaded on the rotation plate.
Figure 9:
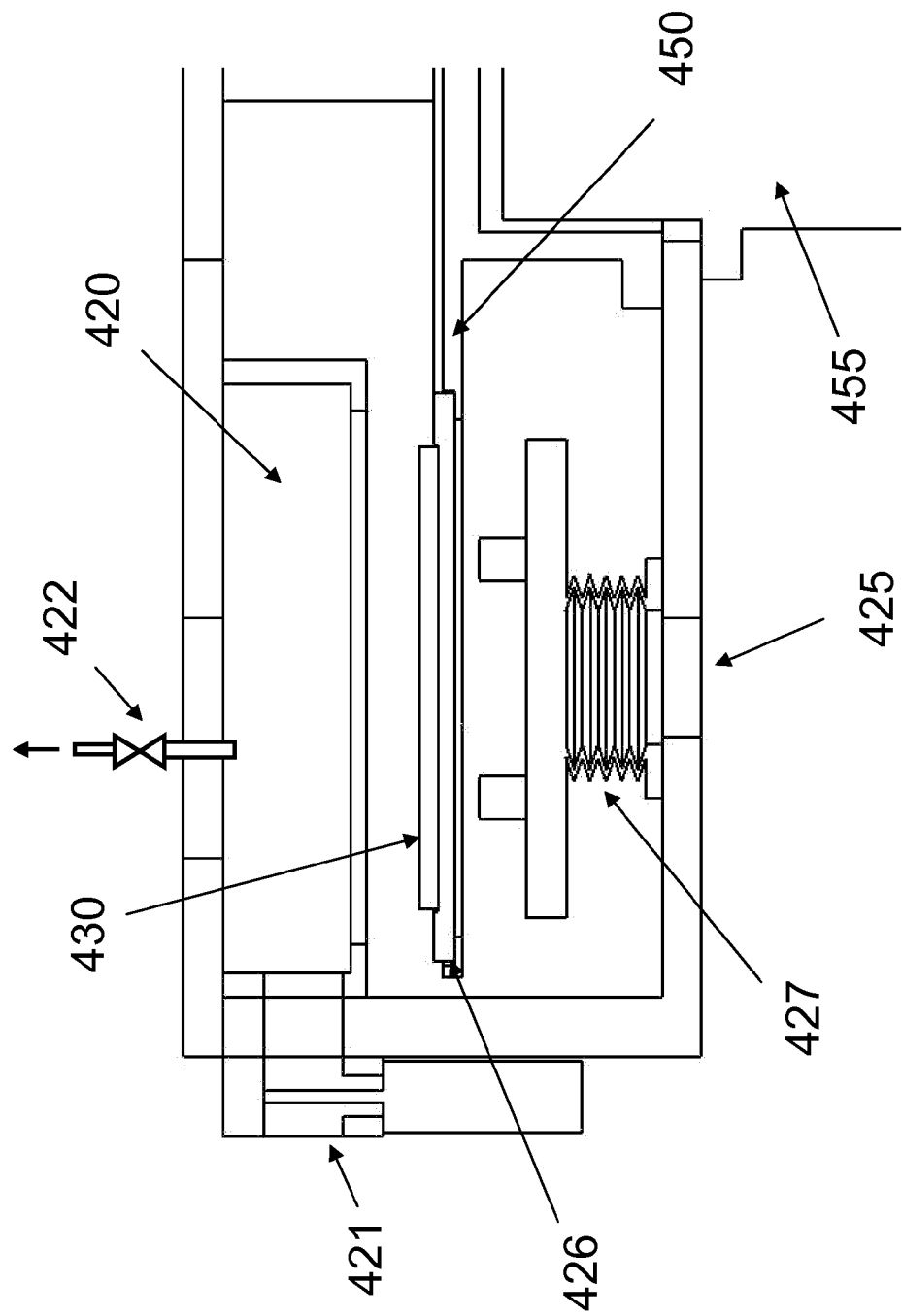
FIG. 9 is another close-up cross-sectional view of the transfer system in the vacuum transfer and processing system of FIG. 8.

The vacuum transfer and processing system 400 or 400A further includes a rotation plate 450 that can be rotated around an axel 455 in the center of the master process chamber 410. The rotation plate 450 can transfer the work piece 430 between the transfer chamber 420 and the processing stations 440-443. After vacuum is established in the transfer chamber 420, the first transfer mechanism 425 can move downward to connect the transfer chamber 420 to the vacuum environment in the master process chamber 410. The moveable plate 426 and the work piece 430 carried on the moveable plate 426 are placed on the rotation plate 450. An opening in the rotation plate 450 allows the moveable activation mechanism of the first transfer mechanism 425 and the bellows 427 to move through the rotation plate 450. FIG. 8 shows a cross-sectional view of the vacuum transfer and processing system 400 when a work piece 430 is carried by the rotation plate 450. FIG. 9 shows a close-up cross-sectional view of the transfer system 420 in FIG. 8.

After the work piece 430 is placed on the rotation plate 450, the work piece 430 and the movable plate 426 can be moved by the rotation plate 450 to the vicinity of the processing stations 440-443. A second transfer mechanism 460 can move the work piece 430 upward off the rotation plate 450 and into the processing station. The second transfer mechanism 460 can include an activation mechanism (not shown) and bellows 467 to isolate the master process chamber from the activation mechanism and the ambient environment. The second transfer mechanism 460 can also include a moveable plate 426 that can include a mating surface for sealing against a counterpart mating surface on the underside of one of the processing stations 440-443.

Figure 10A:
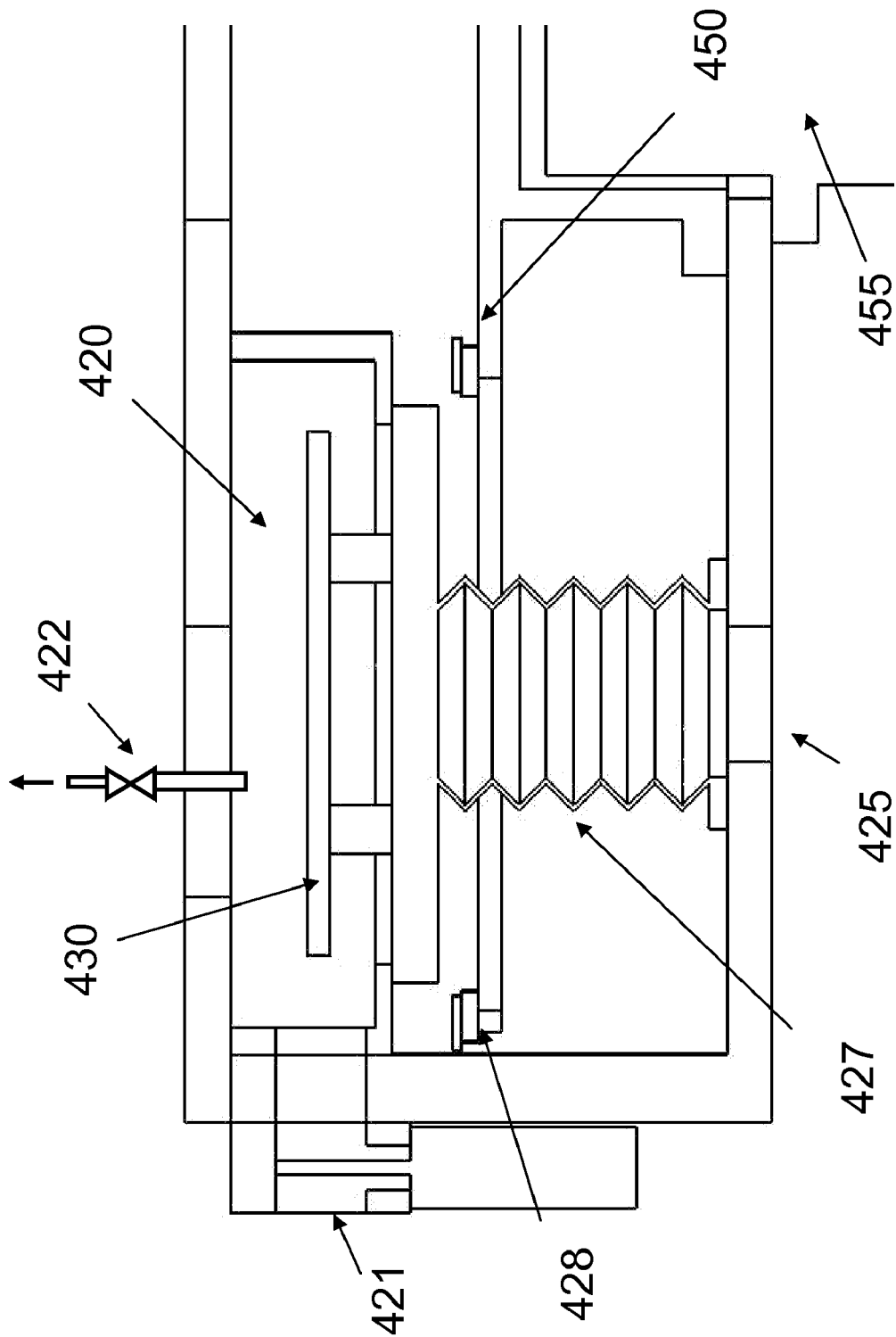
FIG. 10A is a cross-sectional view of the transfer chamber at enclosed position where the work piece is placed directly on the first transfer mechanism.
Figure 10B:
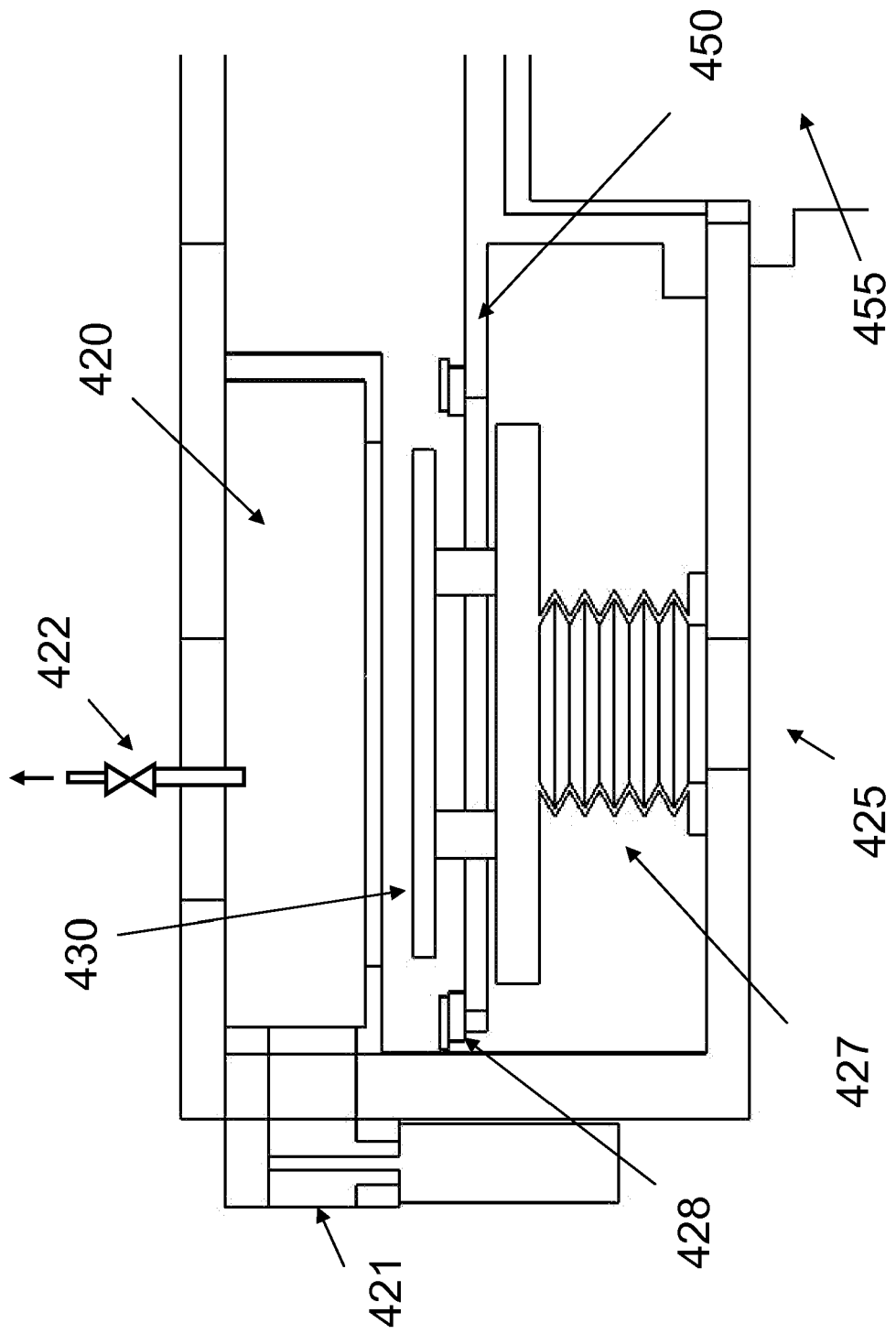
FIG. 10B is a cross-sectional view of the transfer chamber where the work piece is at its drop off position.
Figure 10C:
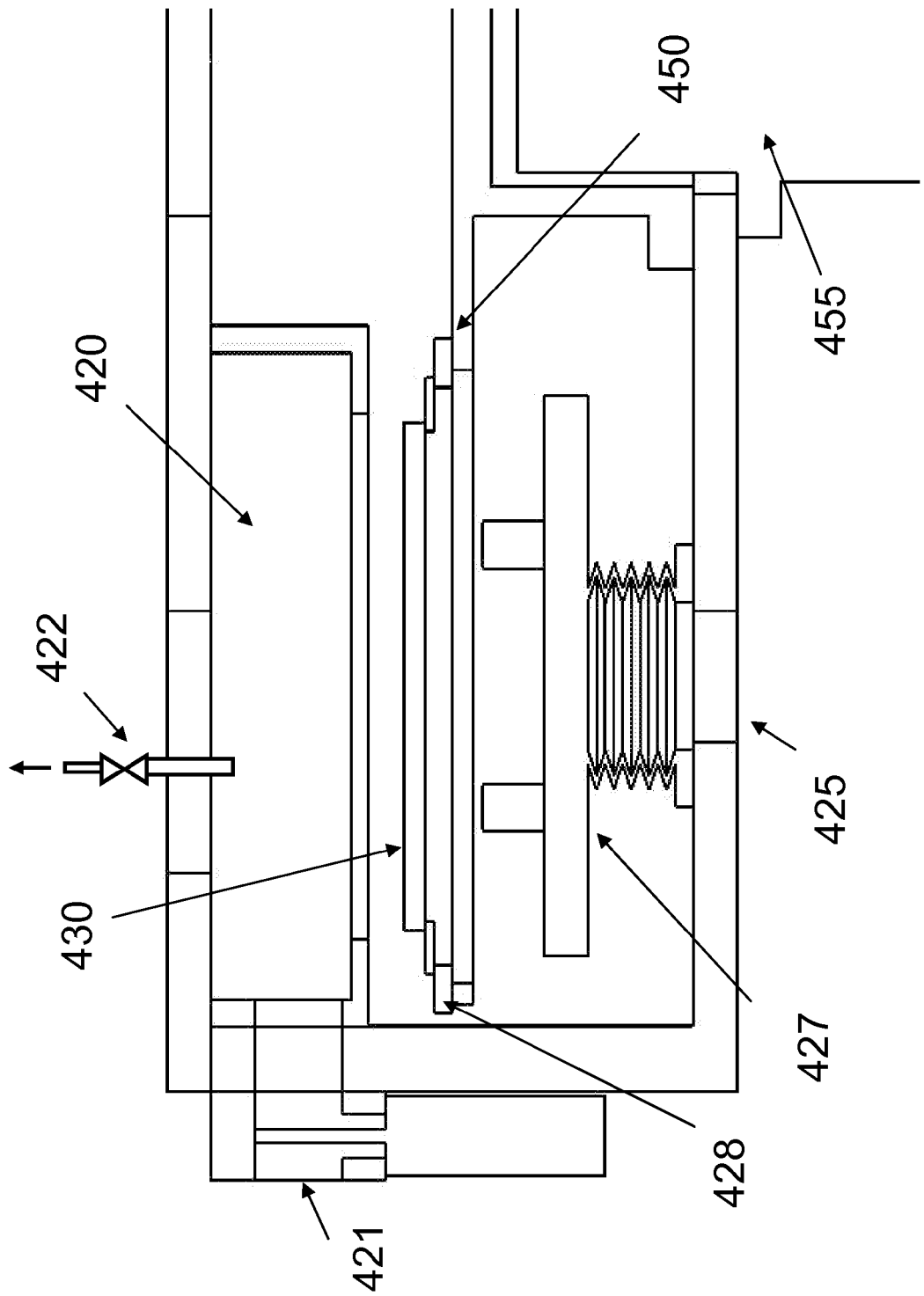
FIG. 10C is a cross-sectional view of the transfer chamber where the work piece is placed on the rotation plate and the rotation plate is ready to transport the work piece to processing stations.

The movable plate holds the work piece and moves with the work piece to various processing stations 440-443 in the above embodiment. The work piece can be heated or cooled by a heating and cooling mechanisms, but the heating and cooling have to pass through the movable plate 426, which may require longer time and compromise control accuracy. In another embodiment, the movable plate 426 can be eliminated to allow the work piece rest directly on the first transfer mechanism 425. As shown in FIGS. 10A to 10C, a mating surface provided on the first transfer mechanism 425 forms a seal with the transfer chamber when an upward force is applied to the first transfer mechanism.

The transfer sequence is described below. First the first transfer mechanism 425 is pushed against the transfer chamber 420 and forms a sealed enclosure. The valve 421 is opened and a work piece 430 is placed on first transfer mechanism 425 (FIG. 10A). Then the valve 421 is closed and the transfer chamber is pumped down to base pressure, the first transfer mechanism 425 is lowered to the work piece drop off position (FIG. 10B). Finally, a plurality of retractable work piece holders 428 mounted on rotation plate 450 are extended and the first transfer mechanism 425 is lowered, and the work piece 430 are placed on the retractable work piece holders 428, FIG. 10C. The work piece holders can be independently controlled or activated by the first transfer mechanism. The removal of the work piece 430 from the processing station 441 is reverse of the above sequence.

Figure 11:
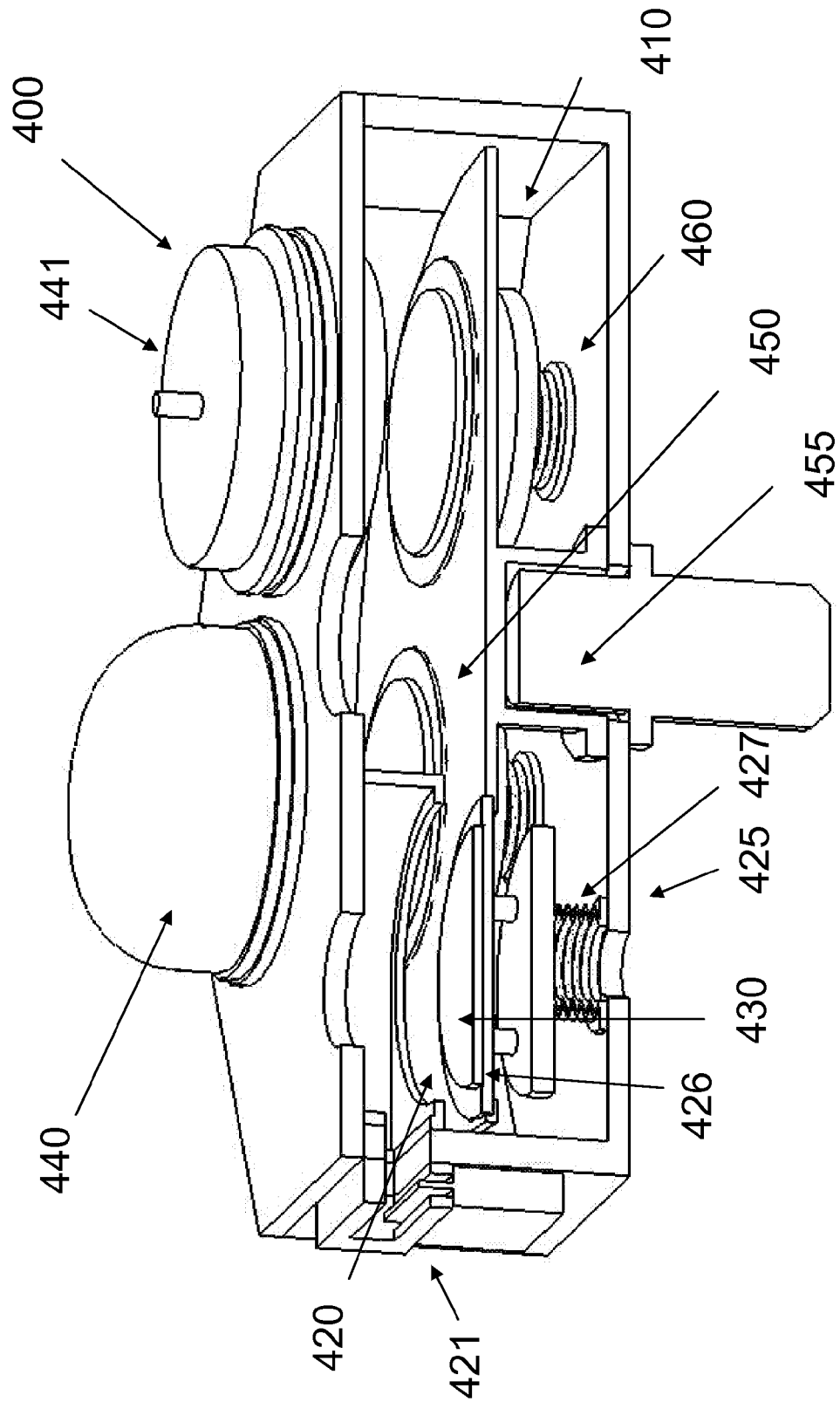
FIG. 11 is a perspective cross-sectional view of the vacuum transfer and processing system with process chambers shown.

FIG. 11 shows a perspective view of the vacuum transfer and processing system 400 having processing stations 440 and 441. The sealed chambers allow independent pressure control and minimize cross contamination between process chambers. The second transfer mechanism 460 at various processing stations can have optional heating, cooling, and voltage biasing (both AC and DC) capabilities. These optional heating and cooling capabilities are used to apply heating and cooling to work piece 430 and to control work piece temperature through the movable plates 426. Typically a higher pressure in master process chamber 410 is present during the heating and cooling of the work piece before processing to ensure faster heat transfer. The optional voltage applied to the second transfer mechanism produce DC or AC bias current to the work piece during processing.

Each rotation of the rotation plate 450 allows a plurality of work pieces 430 to be moved to new processing stations 440-443 or the transfer chamber 420 simultaneously. The work pieces 430 can be processed or unloaded in parallel, which significantly improves system throughput. The second transfer mechanism may optionally lift a plate over the moveable plate 426 to allow the height of the work piece 430 in the processing stations 440-443 to be adjusted.

Figure 12A:
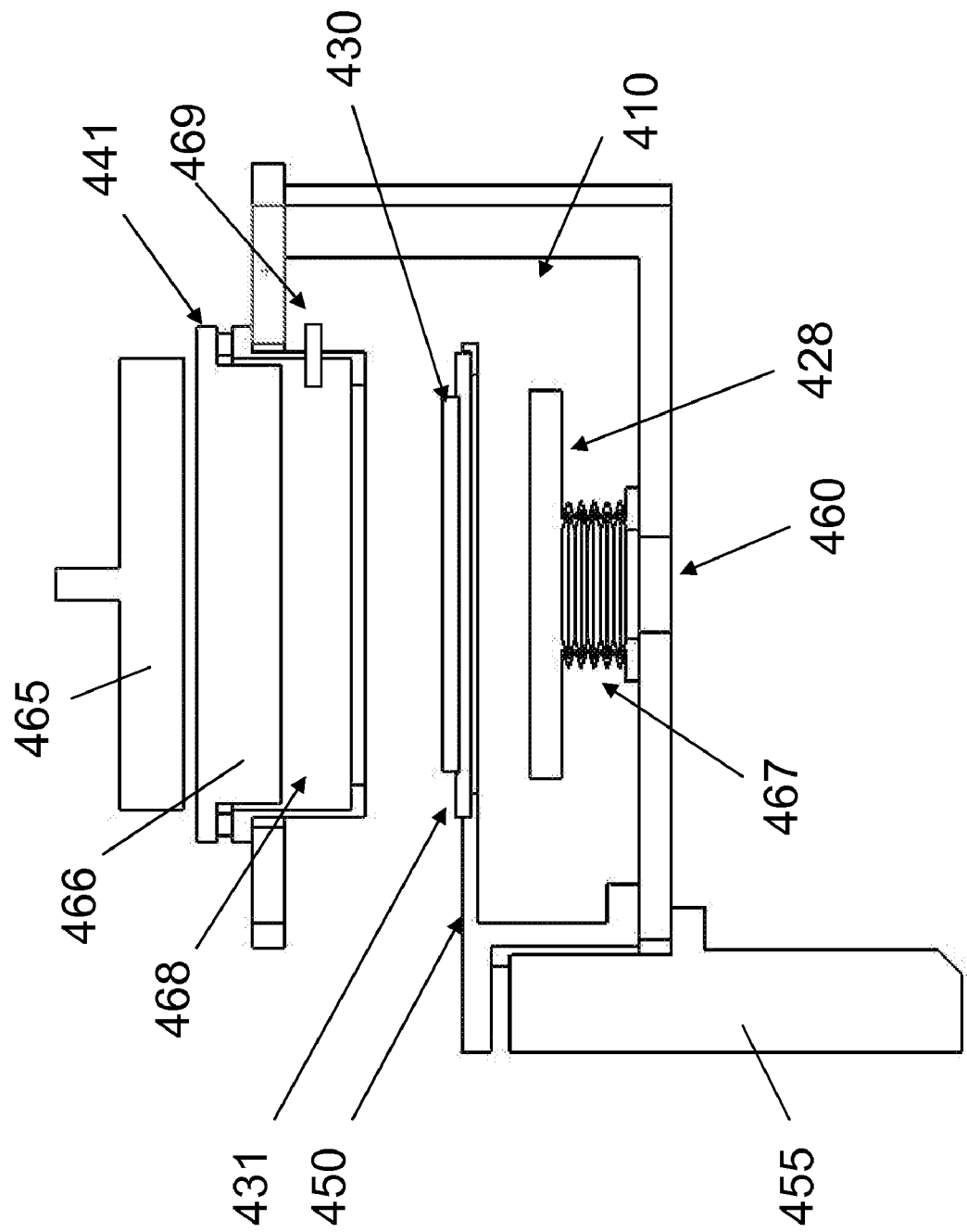
FIG. 12A is a close-up cross-sectional view of a PVD processing station with work piece at transport position.
Figure 12B:
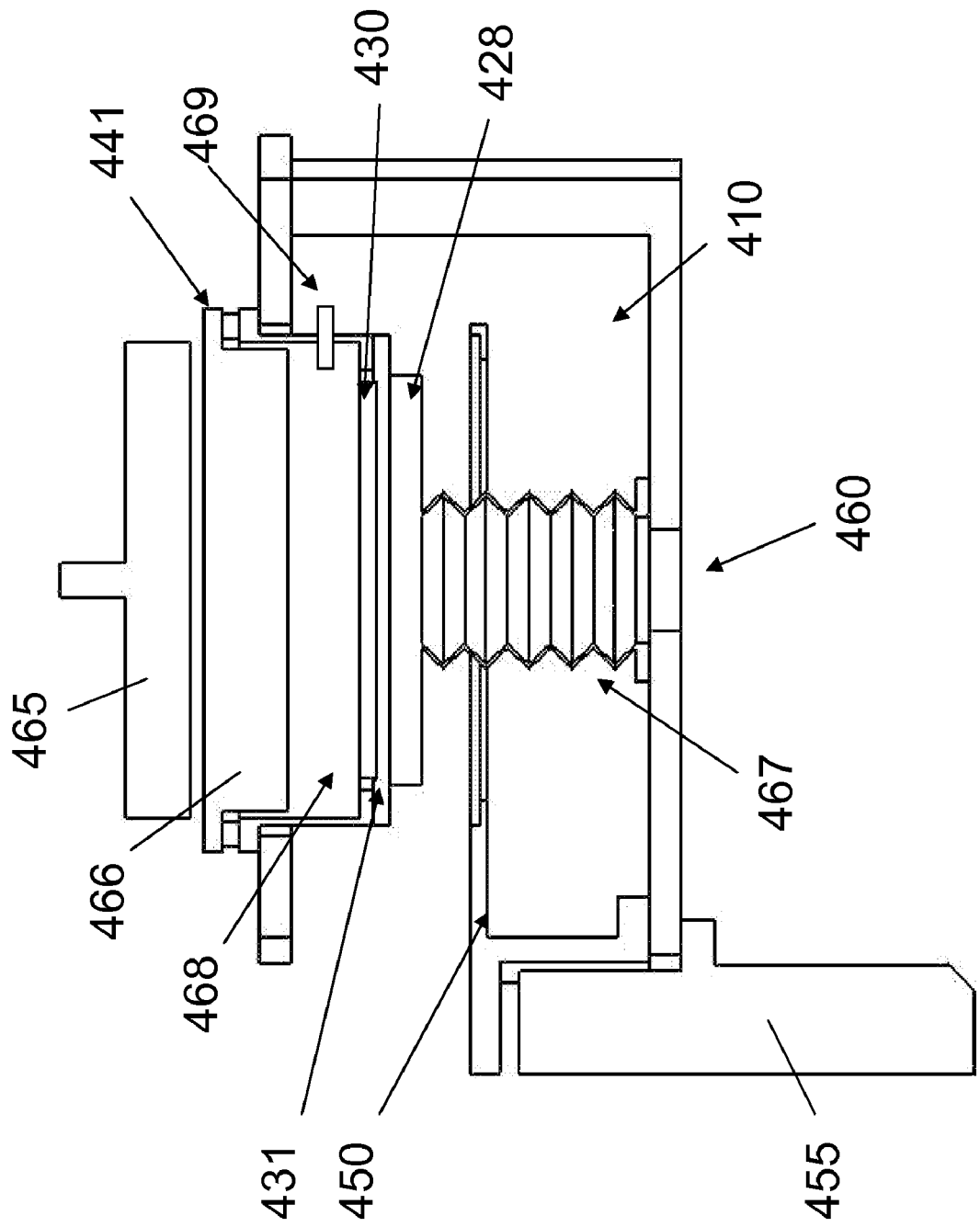
FIG. 12B is a close-up cross-sectional view of the PVD processing station with work piece at process position and the process chamber is sealed off from the master chamber.

FIG. 12A is a close-up cross-sectional view of the PVD processing station 441 with work piece 430 at transport position. FIG. 12B is a close-up cross-sectional view of the PVD processing station 441 with work piece 430 at process position and the process chamber is sealed off from the master chamber. The work piece 430 is transferred by a second transfer mechanism 460 with the assistance of a moveable plate 431. The second transfer mechanism 460 can include an activation mechanism (not shown) and bellows 467 to isolate the master process chamber from the activation mechanism and the ambient environment. The PVD processing station 441 may include one or more magnetron 465, one or more targets 466, and a sealable chamber 468 in which the deposition can be conducted.

In another embodiment, there can be one or more small gas flow paths 469 between a processing stations 440-443 and the master process chamber 410 when the processing stations 440-443 is at the sealed process position. The flow into the processing station will create a higher pressure inside processing station compared to master process chamber, the cross contamination between master process chamber and the processing station is minimized. In this case, the vacuum pump for the master chamber can effectively be used to pump out process chambers that have small gas flow paths into the master process chamber 410. This embodiment can remove the need for vacuum pumps inside process chamber and reduce the system cost.

Figure 13A:
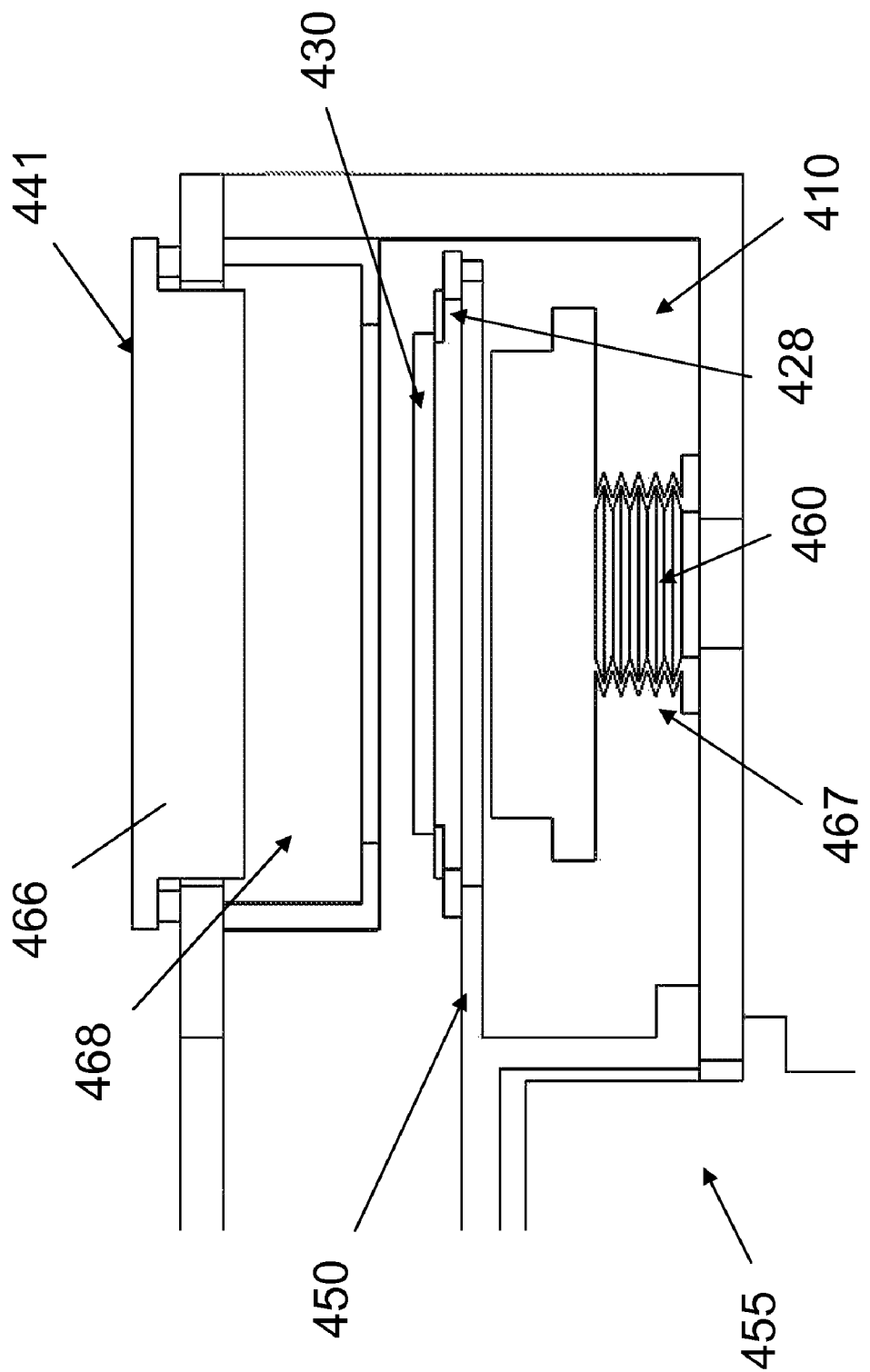
FIG. 13A is a cross-sectional view of a processing station where the work piece is placed on the rotation plate.
Figure 13B:
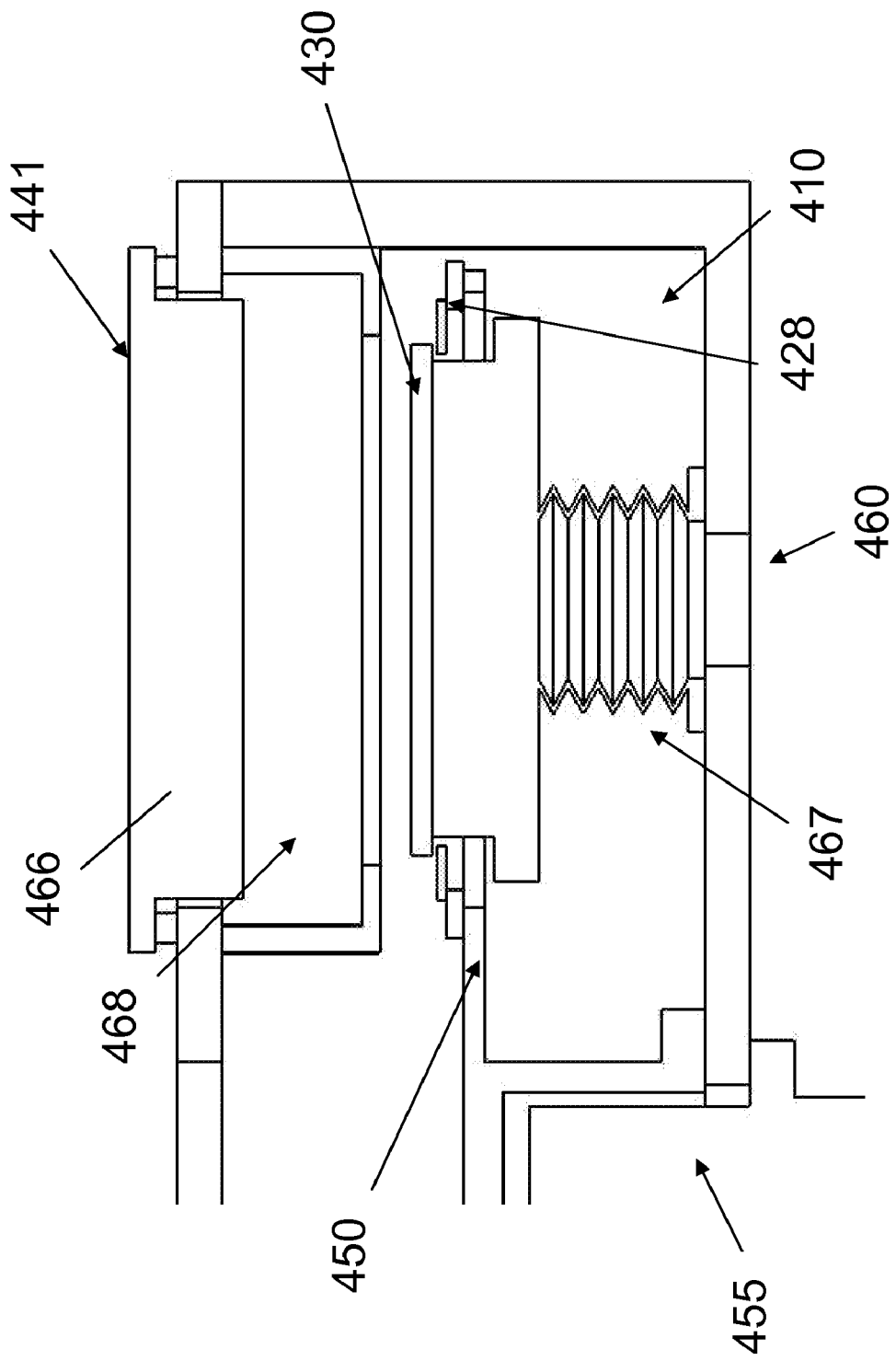
FIG. 13B is a cross-sectional view of the processing station where the second transfer mechanism is raised to pick up the work piece and the work piece holders are still extended.
Figure 13C:
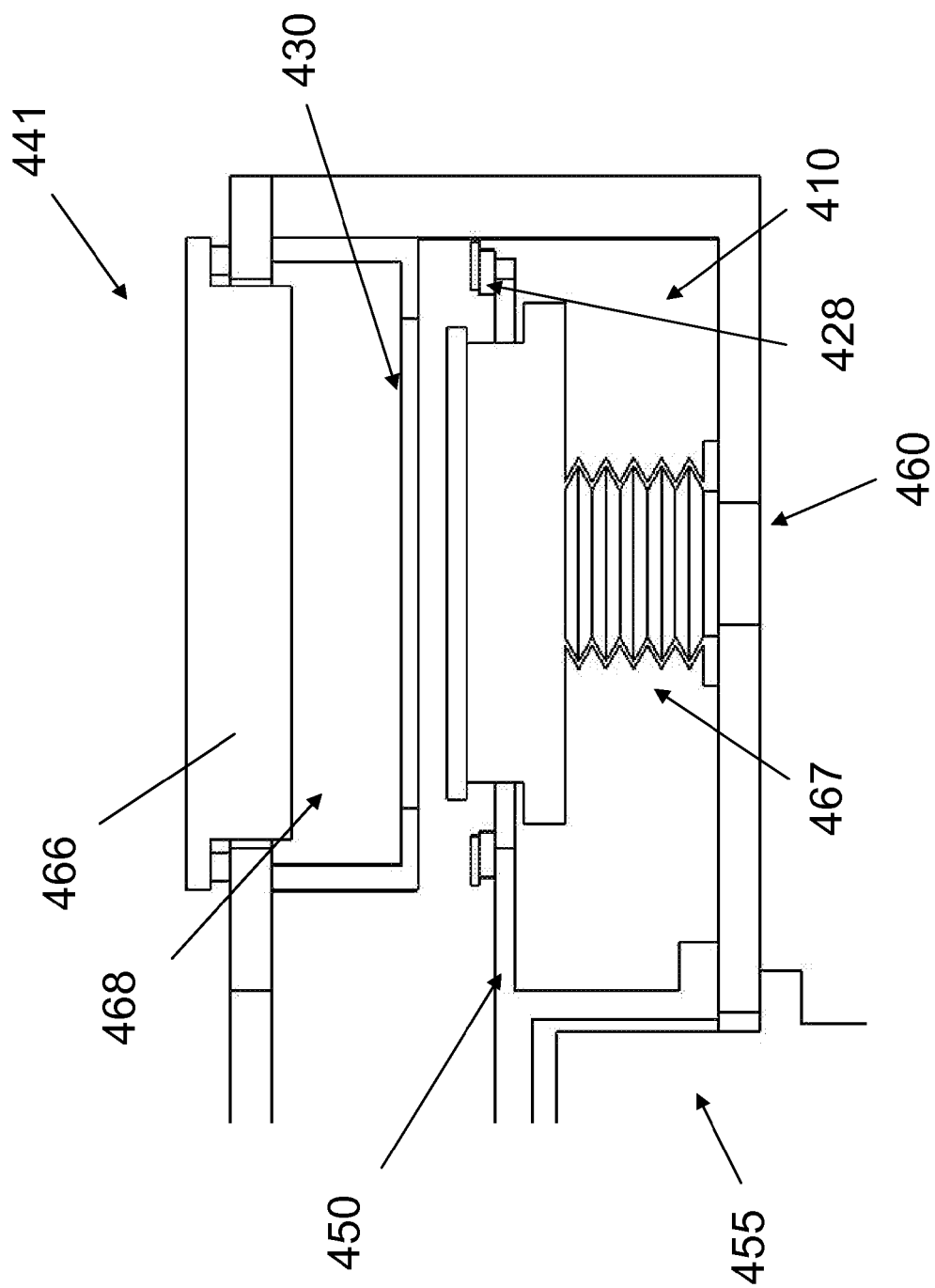
FIG. 13C is a cross-sectional view of the processing station where the second transfer mechanism is raised to pick up the work piece and the work piece holders are retracted to allow the second transfer mechanism to move up.
Figure 13D:
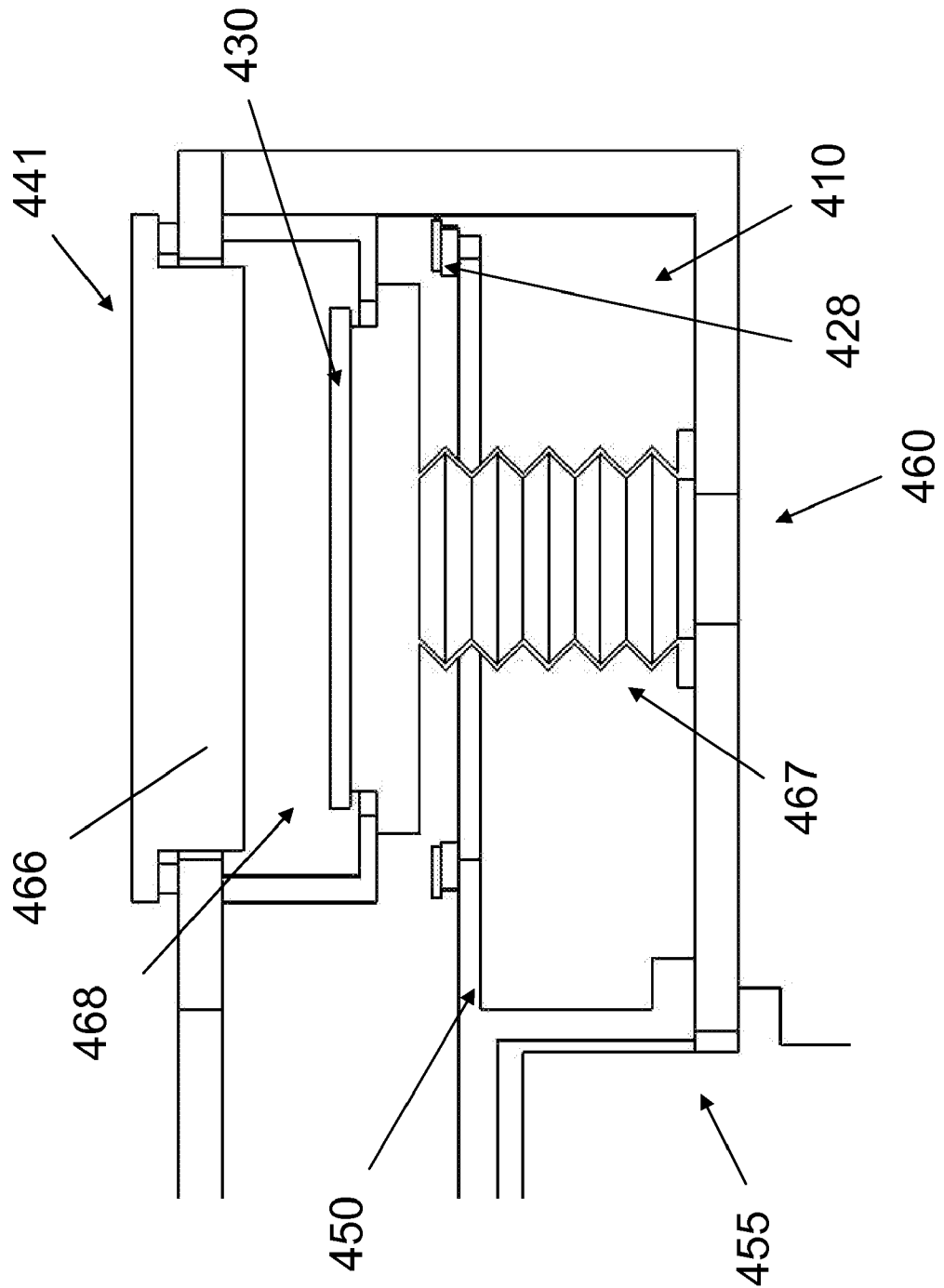
FIG. 13D is a cross-sectional view of the processing station where the second transfer mechanism is raised to the process position and the process chamber is sealed off.

FIGS. 13A to 13D illustrate the transfer of a work piece 430 to a processing station 441 without the use of a moveable plate. After the work piece 430 is placed on the rotation plate 450, the second transfer mechanism 460 is in a lower position to allow the rotation plate 450 to rotate. After the work piece 430 is transferred to the processing station 461, the second transfer mechanism 460 is at lower position (FIG. 13A). The second transfer mechanism 460 rises to pick up the work piece 430 from the retractable work piece holder (FIG. 13B). The retractable work piece holder 428 is retracted to allow the second transfer mechanism 460 to raises the work piece 430 above the rotation plate 450 (FIG. 13C). Finally, the second transfer mechanism 460 is raised to the process position to seal off the processing station 441 (FIG. 13D). The work piece holder 428 can be independently controlled or activated by the second transfer mechanism 460. The removal of the work piece 430 from the processing station 441 is reverse of the above sequence.

Although specific embodiments of the present invention have been illustrated in the accompanying drawings and described in the foregoing detailed description, it shall be understood that the invention is not limited to the particular embodiments described herein, but is capable of numerous rearrangements, modifications, and substitutions without departing from the scope of the invention. The following claims are intended to encompass all such modifications.

What is claimed is:

1. An apparatus for processing work pieces in a vacuum environment, comprising:
    a master process chamber defining a first space therein which is configured to be exhausted to a sub-atmospheric air pressure or to be filled with a gas;
    a transfer chamber enclosed in the master process chamber and configured to be vacuum sealed off from the master process chamber, wherein the transfer chamber defines a second space therein which is configured to receive a first work piece from outside of the master process chamber;
    a plurality of processing chambers comprising a first processing chamber defining a third space therein and a second processing chamber defining a fourth space therein, wherein the first processing chamber comprises a first opening configured to receive a second work piece from the first space in the master process chamber, wherein the second processing chamber comprises a second opening configured to receive a third work piece from the first space in the master process chamber;
    a rotation plate in the master processing chamber and under the plurality of processing chambers, wherein the rotation plate is configured to receive the first work piece from the transfer chamber, the second work piece from the first processing chamber, and the third work piece from the second processing chamber, and to place the first work piece, the second work piece, and the third work piece respectively on a first area, a second area, and a third area on the rotation plate, wherein the rotation plate is configured to move the first work piece, the second work piece, and the third work piece in a single rotation, wherein the rotation plate comprises a first hole in the first area, a second hole in the second area, and a third hole in the third area; and
    a first retractable mechanism comprising a first work-piece holder configured to reach the first work piece through the first hole in the rotation plate and to transfer the first work piece from the transfer chamber to the first area on the rotation plate.

2. The apparatus of claim 1, wherein the rotation plate is configured, in the single rotation, to move the first work piece from under the transfer chamber to under the first processing chamber, and to move the third work piece from under the second processing chamber to under the transfer chamber, wherein the first retractable transport mechanism is configured to lift the third work piece from the third area of the rotation plate to the transfer chamber after the third work piece is positioned under the transfer chamber.

3. The apparatus of claim 1, wherein the plurality of processing chambers further comprises a third processing chamber positioned between the first processing chamber and the second processing chamber, wherein the third processing chamber is configured to receive a fourth work piece from the rotation plate, wherein the rotation plate is configured to receive the fourth work piece from the third processing chamber and to place the fourth work piece on a fourth area on the rotation plate, wherein the rotation plate is configured to move the first work piece, the second work piece, the third work piece, and the fourth work piece in a single rotation.

4. The apparatus of claim 3, wherein the plurality of processing chambers further comprises a fourth processing chamber positioned between the third processing chamber and the second processing chamber, wherein the fourth processing chamber is configured to receive a fifth work piece from the rotation plate, wherein the rotation plate is configured to receive the fifth work piece from the fourth processing chamber and to place the fifth work piece on a fifth area on the rotation plate, wherein the rotation plate is configured to move the first work piece, the second work piece, the third work piece, the fourth work piece, and the fifth work piece in a single rotation.

5. The apparatus of claim 1, wherein the first retractable transport mechanism is configured to vacuum seal the transfer chamber from the master process chamber by sealing an opening in the transfer chamber in an upward movement that a work piece from the rotation plate to the transfer chamber.

6. The apparatus of claim 1, wherein the first retractable transport mechanism comprises a flexible bellow coupled to the first work-piece holder and the master process chamber, wherein the bellow is configured to seal the first space in the master process chamber from an outside environment.

7. The apparatus of claim 1, further comprising:
a second retractable transport mechanism comprising a second work-piece holder configured to reach and carry the second work piece through the second hole in the rotation plate and to transfer the second work piece from the first processing chamber to the second area on the rotation plate; and
a third retractable transport mechanism comprising a third work-piece holder configured to reach and carry the third work piece through the third hole in the rotation plate and to transfer the third work piece from the second processing chamber to the third area on the rotation plate.

8. The apparatus of claim 7, wherein the second retractable transport mechanism is configured to lift the first work piece from the first area of the rotation plate to the first processing chamber after the first work piece is moved from under the transfer chamber to under the first processing chamber.

9. The apparatus of claim 1, wherein the transfer chamber comprises a gate valve that is configured to open to allow the first work piece to be transferred into the transfer chamber.

10. The apparatus of claim 1, further comprising:
a first pump system configured to exhaust the first space in the master process chamber below atmospheric pressure or fill the master process chamber with a gas; and
a second pump system configured to exhaust the second space in the transfer chamber below atmospheric pressure or fill the transfer chamber with a gas.

11. An apparatus for processing work pieces in a vacuum environment, comprising:
a master process chamber defining a first space therein;
a first pump system configured to exhaust the first space in the master process chamber to below atmospheric pressure or fill the first space with a gas;
a transfer chamber enclosed in the master process chamber and configured to be sealed off from the master process chamber, wherein the transfer chamber defines a second space therein which is configured to receive a first work piece from outside of the master process chamber;
a second pump system configured to exhaust the second space in the transfer chamber below atmospheric pressure or fill the transfer chamber with a gas;
one or more processing chambers comprising a first processing chamber defining a third space therein, wherein the first processing chamber includes a gas flow path connecting the first space in the master process chamber and the third space in the first processing chamber, wherein the gas flow path is configured to allow a gas in the third space in the first processing chamber to flow into the first space in the master process chamber from which the gas is configured to be exhausted by the first pump system, wherein the first processing chamber comprises a first opening configured to receive a second work piece from the first space in the master process chamber; and
a rotation plate in the master processing chamber and under the one or more processing chambers, wherein the rotation plate is configured to receive the first work piece from the transfer chamber and the second work piece from the first processing chamber, and to place the first work piece and the second work piece respectively on a first area and a second area on the rotation plate, wherein the rotation plate is configured to move the first work piece and the second work piece in a single rotation, wherein the rotation plate comprises a first hole in the first area and a second hole in the second area.

12. The apparatus of claim 11, wherein the first opening in the first processing chamber is configured to be sealed off from the master process chamber.

13. The apparatus of claim 11, wherein the first processing chamber is not associated with a dedicated pump system for exhausting the third space in the first processing chamber.

14. The apparatus of claim 11, wherein the one or more processing chambers further comprises a second processing chamber, wherein the second processing chamber is configured to receive a third work piece from the rotation plate, wherein the rotation plate is configured to receive the third work piece from the second processing chamber and to place the third work piece on a third area on the rotation plate, wherein the rotation plate is configured to move the first work piece, the second work piece, and the third work piece in a single rotation.

15. The apparatus of claim 14, further comprising:
a first retractable mechanism comprising a first work-piece holder configured to reach and carry the first work piece through the first hole in the rotation plate, wherein the first retractable transport mechanism is configured to transfer the first work piece from the transfer chamber to the first area on the rotation plate; and
a second retractable transport mechanism comprising a second work-piece holder configured to reach and carry the second work piece through the second hole in the rotation plate, wherein the second retractable transport mechanism is configured to transfer the second work piece from the first processing chamber to the second area on the rotation plate.

16. The apparatus of claim 15, wherein the first retractable transport mechanism is configured to lift the third work piece from the third area of the rotation plate to the transfer chamber after the third work piece is positioned under the transfer chamber, wherein the first retractable transport mechanism is configured to vacuum seal the transfer chamber from the master process chamber by sealing an opening in the transfer chamber in an upward movement that lifts the third work piece from the third area of the rotation plate to the transfer chamber.

17. An apparatus for processing work pieces in a vacuum environment, comprising:
a master process chamber defining a first space therein;
a first pump system configured to exhaust the first space in the master process chamber below atmospheric pressure or fill the master process chamber with a gas;
a transfer chamber enclosed in the master process chamber and configured to be vacuum sealed off from the master process chamber, wherein the transfer chamber defines a second space therein which is configured to receive a first work piece from outside of the master process chamber;

a second pump system configured to exhaust the second space in the transfer chamber below atmospheric pressure or fill the transfer chamber with a gas;

a plurality of processing chambers comprising a first processing chamber defining a third space therein and a second processing chamber defining a fourth space therein, wherein the first processing chamber comprises a first opening configured to receive a second work piece from the first space in the master process chamber, wherein the second processing chamber comprises a second opening configured to receive a third work piece from the first space in the master process chamber;

a rotation plate in the master processing chamber and under the transfer chamber, the first processing chamber, and the second processing chamber, wherein the rotation plate is configured to receive the first work piece from the transfer chamber, the second work piece from the first processing chamber, and the third work piece from the second processing chamber, wherein the rotation plate comprises a first hole under the first work piece, a second hole under the second work piece, and a third hole under the third work piece, wherein the rotation plate is configured, in a single rotation, to move the first work piece from under the transfer chamber to under the first processing chamber, to move the second work piece away from the under the first processing chamber, and to move the third work piece from under the second processing chamber to under the transfer chamber, a first retractable mechanism comprising a first work-piece holder configured to reach and carry the first work piece through the first hole in the rotation plate and to transfer the first work piece from the transfer chamber on to the rotation plate;

a second retractable transport mechanism comprising a second work-piece holder configured to reach and carry the second work piece through the second hole in the rotation plate and to transfer the second work piece from the first processing chamber on to the rotation plate; and a third retractable transport mechanism comprising a third work-piece holder configured to reach and carry the third work piece through the third hole in the rotation plate and to transfer the third work piece from the second processing chamber on to the rotation plate.

18. The apparatus of claim 17, wherein the first retractable transport mechanism is configured to lift the third work piece from the rotation plate to the transfer chamber in an upward movement after the third work piece is positioned under the transfer chamber, wherein the transfer chamber is vacuum sealed from the master process chamber in the upward movement, wherein the second retractable transport mechanism is configured to lift the first work piece from the rotation plate to the first processing chamber in an upward movement after the first work piece is positioned under the first processing chamber, wherein the first processing chamber is vacuum sealed from the master process chamber in the upward movement.

19. The apparatus of claim 17, wherein the first opening and the second opening are respectively configured to be sealed off from the first space in the master process chamber, wherein neither of the first processing chamber and the second processing chamber is associated with a dedicated pump system for exhausting the third space in the first processing chamber, wherein the first processing chamber includes a gas flow path connecting the first space in the master process chamber and the third space in the first processing chamber to allow a gas to flow from the third space in the first processing chamber to the first space in the master process chamber wherein the gas is exhausted by the first pump system.

20. The apparatus of claim 17, wherein the first processing chamber includes a gas flow path connecting the first space in the master process chamber and the third space in the first processing chamber, wherein the gas flow path is configured to allow a gas in the third space in the first processing chamber to flow into the first space in the master process chamber from which the gas is configured to be exhausted by the first pump system.

* * * * *